United States Patent [19]

Kunkel

[11] Patent Number: 5,382,175
[45] Date of Patent: Jan. 17, 1995

[54] THERMAL CORE WEDGE CLAMP

[75] Inventor: Scott H. Kunkel, Centreville, Va.

[73] Assignee: E-Systems, Inc., Dallas, Tex.

[21] Appl. No.: 103,033

[22] Filed: Jul. 28, 1993

[51] Int. Cl.$^6$ .............................................. H05K 7/20
[52] U.S. Cl. .................................... 439/327; 361/709;
29/525.1
[58] Field of Search ................ 439/327; 361/707, 709,
361/756, 802, 715; 29/464, 525.1, 825, 428

[56] References Cited

U.S. PATENT DOCUMENTS

| | | | |
|---|---|---|---|
| 3,767,058 | 10/1973 | Barlow et al. | 211/41 |
| 3,820,592 | 6/1974 | Lander | 439/327 |
| 4,157,583 | 6/1979 | Basmajian et al. | 439/327 |
| 4,318,157 | 3/1982 | Rank et al. | 361/709 |
| 4,480,287 | 10/1984 | Jensen | 361/707 |
| 4,821,147 | 4/1989 | Jacobs et al. | 361/707 |
| 4,823,951 | 4/1989 | Colomina | 439/327 |
| 4,971,570 | 11/1990 | Tolle et al. | 439/327 |
| 5,071,013 | 12/1991 | Peterson | 211/41 |

Primary Examiner—Neil Abrams
Attorney, Agent, or Firm—Rogers & Killeen

[57] ABSTRACT

A clamp for seating a circuit card assembly (CCA) in a chassis, and for thereafter establishing thermal contact between the CCA and the chassis, includes a shaft and two wedges that extend substantially the length of the CCA. One wedge is affixed to the CCA and the other wedge moves laterally relative to the fixed wedge to expand the width of the two wedges and thereby urge thermal contact between the CCA and the chassis. The shaft is disposed in mating slots in the sliding faces of the two wedges and is joined to the fixed wedge to seat the CCA in the chassis by threading the shaft into the chassis, without effecting lateral expansion of the wedges. A flanged nut on the shaft may thereafter be used to effect longitudinal movement of the free-floating wedge to laterally expand the two wedges without affecting CCA seating.

21 Claims, 1 Drawing Sheet

THERMAL CORE WEDGE CLAMP

BACKGROUND OF THE INVENTION

The present invention relates to clamps for holding a circuit card assembly in a chassis, and more particularly to a clamp for electrically seating a circuit card assembly in a chassis and for thereafter establishing thermal contact between the circuit card assembly and the chassis by the lateral expansion of thermally conductive wedges.

A circuit card assembly (CCA) is a replaceable package of electronic components mounted on a substrate. Other terms used to identify a CCA are "electronic circuit module", "circuit board", "wiring board" and the like. Typically, a plurality of CCAs are carried by a chassis, that is also referred to as a "rack".

The electronic components on the CCA may generate heat that must be conducted from the components to prevent damage due to overheating. The CCA substrate conducts the heat away from the components, and the chassis is a heat sink for the CCA substrate.

Typically, clamps are used to urge the CCA against the chassis and into a thermally conductive relationship to facilitate thermal conduction therebetween. Some conventional clamps do not conduct an appreciable amount of heat from the CCA to the chassis because of small thermally conductive surface areas in contact with the CCA and the chassis, and, when the clamps include a plurality of short sliding surface wedges, because of small thermally conductive surface areas of wedge-to-wedge contact. See, for example, U.S. Pat. No. 4,823,951 to Colomina, especially FIG. 5. More recent wedge clamps enhance thermal conductivity by providing thermally conductive surfaces that extend substantially the length of one side of the CCA, as shown, e.g., in U.S. Pat. No. 4,971,570 to Tolle, et al.

Clamps are also used to insert a CCA into and to extract a CCA from a chassis. In some CCAs, a substantial force may be required to seat the CCA to make the required electrical connection, i.e., to insure that the CCA is properly seated, and it is desirable that the insertion force be controllable by the user to avoid damage to the chassis or to the CCA.

Clamps that both seat a CCA and provide some thermal conductivity are also known. However, such clamps do not provide the full capability of single purpose clamps, generally have a small thermally conductive surface area and do not provide a controllable insertion force which is selectively variable. Moreover, they may be difficult to operate, maintain and manufacture. For example, the clamp in U.S. Pat. No. 4,821,147 to Jacobs, et al. includes a shape memory alloy that is heated to automatically and sequentially insert the CCA and expand the wedges.

Accordingly, it is an object of the present invention to provide a novel clamp and method that obviates the problems of the prior art and operates simply to both seat a CCA and urge thermal conductivity between the CCA and a chassis.

It is another object of the present invention to provide a novel clamp and method in which the forces of CCA insertion and wedge expansion are selectively variable independently of one another.

It is yet another object of the present invention to provide a novel clamp and method which does not require either electrical or thermal controls in the insertion of the CCA into the chassis and in the expansion of the wedges.

It is a further object of the present invention to provide a novel clamp and method in which a single shaft is used to independently seat a CCA to insure an electrical connection and to expand the two wedges that provide for heat transfer.

It is still a further object of the present invention to provide a novel clamp and method in which a single shaft effects longitudinal motion of one wedge to seat a CCA and a nut on the shaft effects longitudinal motion of a cooperating wedge to urge the CCA into a thermally conductive relationship with the chassis.

It is yet a further object of the present invention to provide a novel clamp and method in which a clamp that seats a CCA in a chassis with a controllable force also provides thermal conductivity through the clamp over a substantial portion of a length of a side of the CCA.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 1:
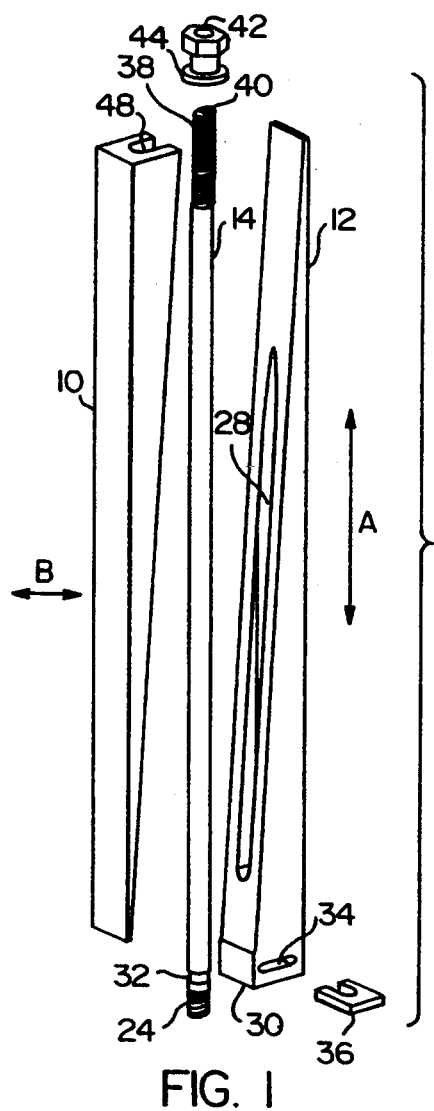
FIG. 1 is an exploded pictorial representation of the clamp of the present invention.
Figure 2:
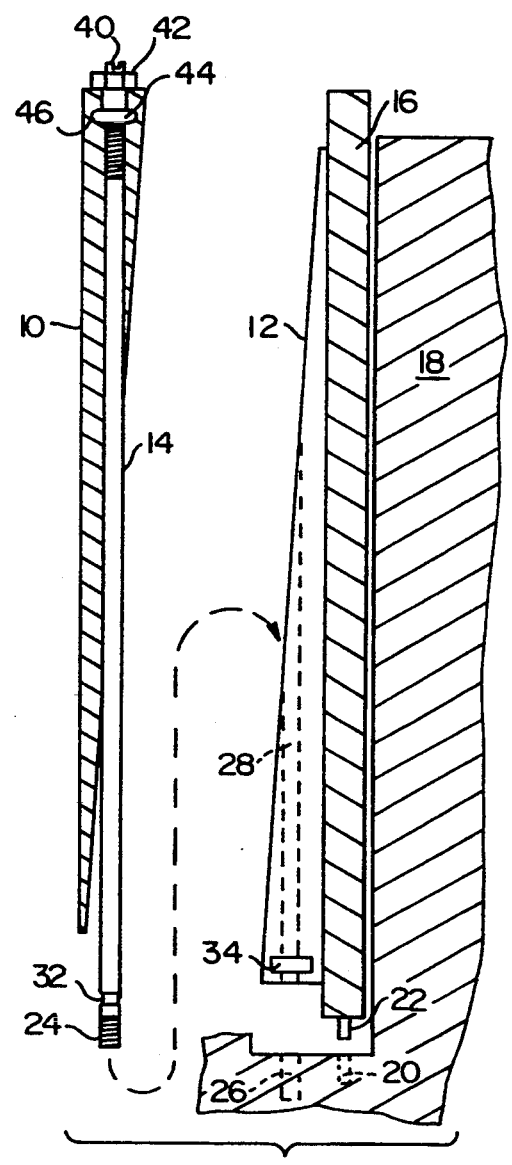
FIG. 2 is a partial cutaway, exploded pictorial representation of the clamp of FIG. 1 with one of the wedges attached to a CCA to illustrate the insertion of the CCA into the chassis.

With reference now to FIGS. 1 and 2, the present invention may include two wedges 10 and 12 with a shaft 14 therebetween. The wedge 12 may be attached to, or otherwise carried by a CCA 16 so that longitudinal movement of the wedge 12 (indicated by arrow A in FIG. 1) moves the CCA 16 longitudinally to seat the CCA 16 in a chassis 18 (for example, by mating electrical connections 20 and 22 shown in FIG. 2). The wedge 10 is free-floating relative to the wedge 12 and the CCA 16, and has a ramped surface facing the ramped surface of the wedge 12. When the wedges 10 and 12 are moved longitudinally (arrow A) relative to each other, the lateral width of the two wedges expands and contracts (arrow B in FIG. 1). When positioned in a chassis, the expansion of the wedges urges the CCA and chassis into a thermally conductive relationship. To enhance the thermal conductivity of the clamp, both wedges may be made of conventional thermally conductive material, and have lengths that are desirably substantially the same as the length of a side of the CCA 16.

The shaft 14 may be threaded at both ends, with the threads at the inserted end 24 being adapted to engage a threaded hole 26 in the chassis 18 that facilitates seating the CCA in the chassis. The shaft 14 fits into corresponding hole 28 in the wedge 12 so that the threads at the end 24 extend beyond the end 30 of the wedge. The inserted end 24 of the shaft 14 may have a peripheral groove 32 that is aligned with a slot 34 in the wedge when the shaft 14 is inserted into the wedge 12. A retainer 36 may be provided that fits into the slot 34 and into the groove 32 to prevent longitudinal motion of the shaft 14 relative to the wedge 14, while allowing the shaft 14 to rotate about its longitudinal axis. The retainer 36 may be U-shaped as shown, or take other shapes suitable for the purpose.

The exposed end 38 of the shaft 14 may be configured for a turning device (e.g., a slot 40 for a screwdriver or a nut driver). When the shaft 14 is rotated, the inserted end 24 may be threaded into the chassis hole 26 to move the wedge 14 and attached chassis longitudinally and thereby electrically seat the CCA 16. The configuration 40 of the exposed end of the shaft 14 may be adapted to receive a force measuring device, such as a torque wrench, so that the force applied to the shaft may be controlled.

With further reference to FIGS. 1 and 2, the threads at the exposed end 38 of the shaft may be adapted to receive a nut 42 or similar device. The nut 42 may be used to move the wedge 10 longitudinally relative to wedge 12, thereby laterally expanding the combined width of the two wedges (arrow B) to urge the CCA into a thermally conductive relationship with the chassis. The nut 42 may include a flange 44 or similar feature that fits into a corresponding channel 46 in a trench 48 in the wedge 10 and that may be used to laterally contract the two wedges. When the shaft 14 is placed in the trench 48 and the flange 44 mated with channel 46, the nut 42 may be rotated to effect longitudinal movement of the wedge 10. As is apparent, operation of the nut 42 to expand and/or contract the wedges does not rotate the shaft 14 and does not affect the seating the CCA in the chassis. The nut 42 may also be adapted to be operated by a force measuring device so that the expansive pressure of the wedges may be controlled.

The relative placement of the wedges 10 and 12 illustrated in FIG. 2 provides the added feature of inhibiting slippage of the CCA out of the chassis (i.e., upward movement of wedge 12 causes further lateral expansion, tightening the hold of the clamp). The wedges may be arranged in the other direction if desired.

Figure 3:
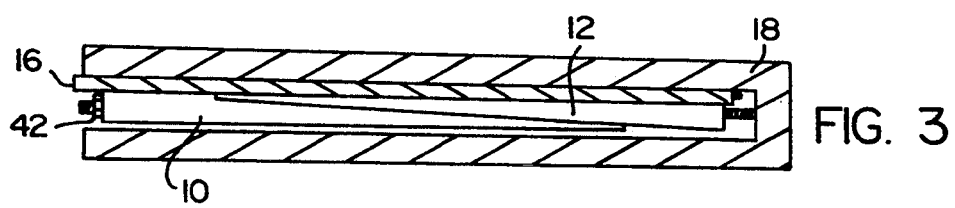
FIG. 3 is a side view in cross-section of the clamp of the present invention in a chassis before being electrically seated.
Figure 4:
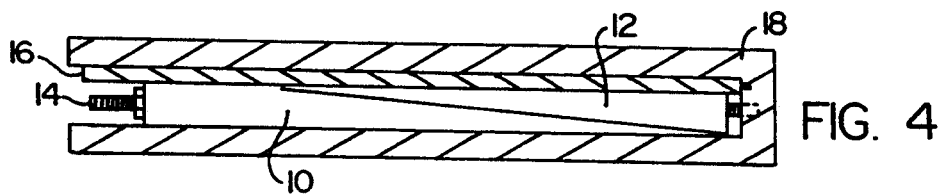
FIG. 4 is a side view in cross-section of the clamp of the present invention in a chassis after being electrically seated and after the wedges have been expanded for thermal contact.

Operation of the present invention may be seen more clearly with reference to FIGS. 3 and 4. FIG. 3 illustrates the clamp of the present invention affixed to a CCA 16 before seating the CCA 16 in the chassis 18. Once placed in this position, the inserted end 24 of the shaft 14 may be threaded into the corresponding hole in the chassis to electrically seat the CCA and hold it in position. Thereafter, the nut 42 may be rotated to expand the two wedges. FIG. 4 illustrates the clamp and CCA after the shaft has been rotated to thread the shaft into the chassis and after the nut 42 has been rotated to expand the wedges 10 and 12. As will be apparent from the figures, rotation of the shaft 14 to seat the CCA 16 is independent of rotation of the nut 42 to expand the wedges, and vice versa. The simple two-step operation of the present invention has many advantages over the clamps of the prior art and may be particularly useful in the controlled extraction of the CCA from the chassis after the lateral pressure is relieved.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A clamp for seating a circuit card assembly (CCA) in a chassis and for establishing thermal contact between the CCA and the chassis, the clamp comprising:
    a fixed wedge carried by a shaft, said fixed wedge effecting longitudinal movement of any CCA carried by said fixed wedge;
    a movable wedge that is free-floating relative to said fixed wedge,
    said shaft being threaded at an inserted end so that rotation thereof effects movement of said fixed wedge relative to the chassis to seat the CCA carried by said first wedge in the chassis without effecting the relative position of said fixed wedge to said movable wedge;
    a flanged nut at an exposed end of said shaft to move said movable wedge relative to said fixed wedge to establish thermal contact between the CCA and the chassis without effecting seating of the CCA in the chassis; and
    a U-shaped retainer inserted into a lateral slot in said fixed wedge for preventing longitudinal motion of said fixed wedge relative to said shaft while allowing said shaft to rotate.

2. The clamp of claim 1 wherein said movable wedge and fixed wedge are substantially the same length as a side of the CCA.

3. The clamp of claim 1 wherein said U-shaped retainer is removably insertable into said slot in said fixed wedge.

4. The clamp of claim 1 wherein said shaft has a first diameter within said fixed wedge, except at a groove adjacent said slot that has a second diameter smaller than said first diameter, and wherein said U-shaped retainer has a notch with an opening larger than said second diameter and smaller than said first diameter that mates with said groove.

5. A clamp for seating a circuit card assembly (CCA) in a chassis and for establishing thermal contact between the CCA and the chassis, the clamp comprising:
    a fixed wedge adapted to carry a CCA;
    a movable wedge longitudinally movable relative to said fixed wedge to laterally expand the two said wedges to thereby facilitate thermal contact between the chassis and the CCA;
    means to (a) engage the chassis to selectively longitudinally move said fixed wedge relative to the chassis without effecting relative movement between the two said wedges, and to (b) independently and selectively move said wedges longitudinally relative to each other without effecting relative movement between said fixed wedge and the chassis
    said means comprising a shaft with a groove therein for mating with a U-shaped retainer removably inserted into said fixed wedge that prevents longitudinal motion of said fixed wedge relative to said shaft while allowing said shaft to rotate.

6. The clamp of claim 5 wherein said means comprises mechanical means without electrical controls.

7. The clamp of claim 5 wherein said means comprises mechanical means without thermal controls.

8. The clamp of claim 5 wherein said means comprises mechanical means without springs.

9. The clamp of claim 5 wherein said shaft is disposed in mating slots in faces of the two said wedges.

10. The clamp of claim 9 wherein said shaft is threaded at an inserted end to longitudinally move said fixed wedge relative to the chassis.

11. The clamp of claim 9 wherein said means further comprises a nut on an exposed end of said shaft for moving said wedges longitudinally relative to each other.

12. The clamp of claim 11 wherein said nut comprises a flange for laterally contracting the two said wedges.

13. In a clamp for holding a circuit card assembly (CCA) in a chassis and for establishing thermal contact between the CCA and the chassis, the clamp having two wedges with a first of the two wedges being affixed to a CCA, the improvement comprising:

a U-shaped retainer removably inserted into a lateral slot in said first wedge for engaging shoulders of a groove on a shaft disposed between said two wedges to (a) engage the chassis to selectively longitudinally move the first wedge relative to the chassis without effecting relative movement between the two wedges, and to (b) independently and selectively move the wedges longitudinally relative to each other without effecting relative movement between the first wedge and the chassis.

14. A clamp for holding a circuit card assembly (CCA) in a chassis and for establishing thermal contact between the CCA and the chassis, the clamp comprising:

a first wedge that extends substantially the length of a side of a CCA that is to be placed in thermal contact with the chassis;

a shaft longer than said first wedge that extends therethrough, the shaft being threaded at both ends and having a circumferential groove adjacent a first end and means in a second end for effecting rotation of said shaft;

a retainer extending through a recess in said first wedge and into said groove for preventing longitudinal motion of said shaft relative to said first wedge while allowing said shaft to rotate;

a second wedge having a length substantially the same as said first wedge and having a longitudinal trench therein for said shaft, said second wedge having a lateral channel in said trench adjacent the second end of said shaft; and a flanged nut carried on the threads at the second end of said shaft, the flange thereof extending into said channel to move said second wedge longitudinally when said nut is rotated, whereby said shaft may be rotated to seat the first end of the shaft in the chassis, and whereby said nut may be rotated to laterally expand the width of said two wedges to establish thermal contact between the chassis and the CCA.

15. The clamp of claim 14 wherein said retainer is U-shaped with a U-shaped notch therein that has an opening larger than the diameter of said groove and smaller than the diameter of said shaft.

16. The clamp of claim 14 wherein said retainer is removably insertable into the slot.

17. The clamp of claim 14 wherein said shaft has a constant diameter within said first wedge, except at said groove where the diameter is less than the diameter of said shaft.

18. A method of seating a circuit card assembly (CCA) in a chassis and of establishing thermal contact between the CCA and the chassis, the method comprising the steps of:

providing a shaft between two wedges, a first one of the wedges being affixed to the CCA;

inserting a retainer into a slot in the first wedge that mates with a groove in the shaft for preventing longitudinal motion of the shaft relative to the first wedge;

rotating said shaft to seat the CCA in the chassis;

providing rotatable means on the shaft; and rotating said rotatable means to move the wedges relative to one another to establish thermal contact between the CCA and chassis.

19. The method of claim 18 further comprising the step of providing the retainer with a U-shaped notch with an opening larger than the diameter of the groove and smaller than the diameter of the shaft.

20. The method of claim 19 wherein the retainer is removably inserted into the slot.

21. The method of claim 19 wherein the shaft has a constant diameter within the first wedge, except at the groove where the diameter is less than the diameter of the shaft.

* * * * *